(12) United States Patent
Kim et al.

(10) Patent No.: US 12,284,845 B2
(45) Date of Patent: Apr. 22, 2025

(54) SEMICONDUCTOR LIGHT EMITTING DEVICE HAVING REFLECTIVE ELECTRODE ON MULTILAYER INSULATING STRUCTURE

(71) Applicant: SAMSUNG ELECTRONICS CO., LTD., Suwon-si (KR)

(72) Inventors: Minkyun Kim, Seongnam-si (KR); Donghyuk Joo, Suwon-si (KR); Inho Kim, Hwaseong-si (KR); Seungmi Son, Hwaseong-si (KR); Sungwook Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 501 days.

(21) Appl. No.: 17/711,165

(22) Filed: Apr. 1, 2022

(65) Prior Publication Data

US 2023/0047372 A1 Feb. 16, 2023

(30) Foreign Application Priority Data

Aug. 11, 2021 (KR) .................. 10-2021-0106263

(51) Int. Cl.
*H10H 20/841* (2025.01)
*H10H 20/821* (2025.01)
(Continued)

(52) U.S. Cl.
CPC ........ *H10H 20/841* (2025.01); *H10H 20/821* (2025.01); *H10H 20/833* (2025.01);
(Continued)

(58) Field of Classification Search
CPC ....... H01L 33/46; H01L 33/24; H01L 33/405; H01L 33/42; H01L 33/62
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

CN 110797443 A 2/2020
CN 212725355 U 3/2021
(Continued)

*Primary Examiner* — Michael Jung
(74) *Attorney, Agent, or Firm* — Muir Patent Law, PLLC

(57) ABSTRACT

A semiconductor light emitting device including a substrate; a light emitting structure including a first conductivity-type semiconductor layer, an active layer, and a second conductivity-type semiconductor layer sequentially stacked on the substrate; a transparent electrode layer on the second conductivity-type semiconductor layer; a first insulating layer on the transparent electrode layer and having a plurality of first through-holes; a multilayer insulating structure on the first insulating layer and having a plurality of second through-holes overlapping the plurality of first through-holes, respectively, the multilayer insulating structure being spaced apart from an edge of the light emitting structure; a reflective electrode layer on the multilayer insulating structure and connected to the transparent electrode layer through the plurality of first through-holes and the plurality of second through-holes; and a second insulating layer between the multilayer insulating structure and the reflective electrode layer.

20 Claims, 19 Drawing Sheets

I-I'

(51) Int. Cl.
  *H10H 20/832* (2025.01)
  *H10H 20/833* (2025.01)
  *H10H 20/857* (2025.01)
  *H10H 20/01* (2025.01)

(52) U.S. Cl.
  CPC ........ *H10H 20/835* (2025.01); *H10H 20/857* (2025.01); *H10H 20/032* (2025.01); *H10H 20/034* (2025.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 10,573,786 B2 | 2/2020 | Yoon et al. |
| 2019/0237626 A1 | 8/2019 | Yoon et al. |
| 2019/0273187 A1* | 9/2019 | Yoon ........................ H01L 33/46 |
| 2019/0348571 A1* | 11/2019 | Kim ........................ H01L 33/52 |
| 2020/0020739 A1* | 1/2020 | Chen ..................... H01L 27/156 |
| 2020/0044116 A1 | 2/2020 | Chen et al. |
| 2020/0140750 A1 | 5/2020 | Torimoto et al. |
| 2020/0357955 A1 | 11/2020 | Chuang et al. |

FOREIGN PATENT DOCUMENTS

| | | |
|---|---|---|
| JP | 2014-053593 A | 3/2014 |
| KR | 10-2020-0095191 A | 8/2020 |
| KR | 10-2021-0017280 A | 2/2021 |

* cited by examiner

SEMICONDUCTOR LIGHT EMITTING DEVICE HAVING REFLECTIVE ELECTRODE ON MULTILAYER INSULATING STRUCTURE

CROSS-REFERENCE TO RELATED APPLICATION

This application claims benefit of priority to Korean Patent Application No. 10-2021-0106263 filed on Aug. 11, 2021, in the Korean Intellectual Property Office, the disclosure of which is incorporated herein by reference in its entirety.

BACKGROUND

1. Field

Embodiments relate to a semiconductor light emitting device.

2. Description of the Related Art

Semiconductor light emitting devices are next-generation light sources having advantages such as long lifespan, low power consumption, fast response speed, and environmental friendliness, as compared to related art light sources, and have come to prominence as important light sources in various products such as lighting devices and backlights of display devices.

SUMMARY

The embodiments may be realized by providing a semiconductor light emitting device including a substrate; a light emitting structure including a first conductivity-type semiconductor layer, an active layer, and a second conductivity-type semiconductor layer sequentially stacked on the substrate; a transparent electrode layer on the second conductivity-type semiconductor layer; a first insulating layer on the transparent electrode layer and having a plurality of first through-holes; a multilayer insulating structure on the first insulating layer and having a plurality of second through-holes overlapping the plurality of first through-holes, respectively, the multilayer insulating structure being spaced apart from an edge of the light emitting structure; a reflective electrode layer on the multilayer insulating structure and connected to the transparent electrode layer through the plurality of first through-holes and the plurality of second through-holes; and a second insulating layer between the multilayer insulating structure and the reflective electrode layer.

The embodiments may be realized by providing a semiconductor light emitting device including a light emitting structure having a stack structure including a first conductivity-type semiconductor layer, an active layer, and a second conductivity-type semiconductor layer and including a recess region in which the second conductivity-type semiconductor layer, the active layer, and a portion of the first conductivity-type semiconductor layer have been removed and a mesa region adjacent to the recess region; a transparent electrode layer on the second conductivity-type semiconductor layer; a first insulating layer on the transparent electrode layer and having a plurality of first through-holes overlapping the mesa region; a multilayer insulating structure on the first insulating layer and having a plurality of second through-holes overlapping the plurality of first through-holes, respectively, the multilayer insulating structure being spaced apart from an edge of the light emitting structure; a second insulating layer covering upper and side surfaces of the multilayer insulating structure; and a reflective electrode layer on the second insulating layer and connected to the transparent electrode layer through the plurality of first through-holes and the plurality of second through-holes.

The embodiments may be realized by providing a semiconductor light emitting device including a light emitting structure including a first conductivity-type semiconductor layer, an active layer, and a second conductivity-type semiconductor layer that are sequentially stacked; a transparent electrode layer on the second conductivity-type semiconductor layer; a first insulating layer on the transparent electrode layer and having a first through-hole; a multilayer insulating structure on the first insulating layer and having a second through-hole overlapping the first through-hole; a reflective electrode layer on the multilayer insulating structure and connected to the transparent electrode layer through the first through-hole and the second through-hole; a second insulating layer between the multilayer insulating structure and the reflective electrode layer; and a third insulating layer covering upper and side surfaces of the reflective electrode layer, wherein the first insulating layer and the third insulating layer are in direct contact with each other at an edge of the light emitting structure.

BRIEF DESCRIPTION OF DRAWINGS

Features will be apparent to those of skill in the art by describing in detail exemplary embodiments with reference to the attached drawings in which.

DETAILED DESCRIPTION

Figure 1:
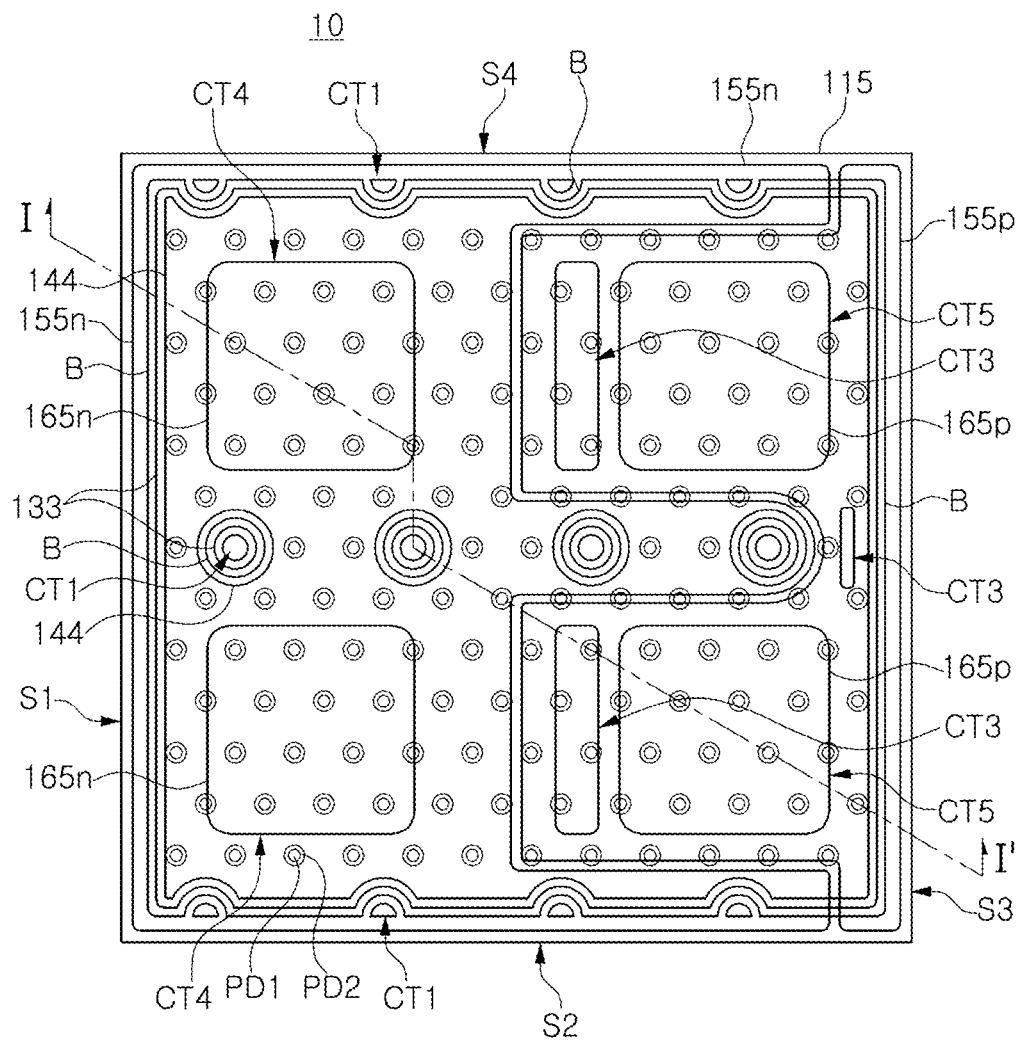
FIG. 1 is a schematic plan view of a semiconductor light emitting device according to an embodiment.

An example of a semiconductor light emitting device 10 according to an embodiment is described with reference to FIGS. 1 and 2. FIG. 1 is a plan view schematically illustrating an example of the semiconductor light emitting device 10 according to an embodiment, and FIG. 2 is a cross-sectional view schematically illustrating a region taken along line I-I' of FIG. 1.

Figure 2:
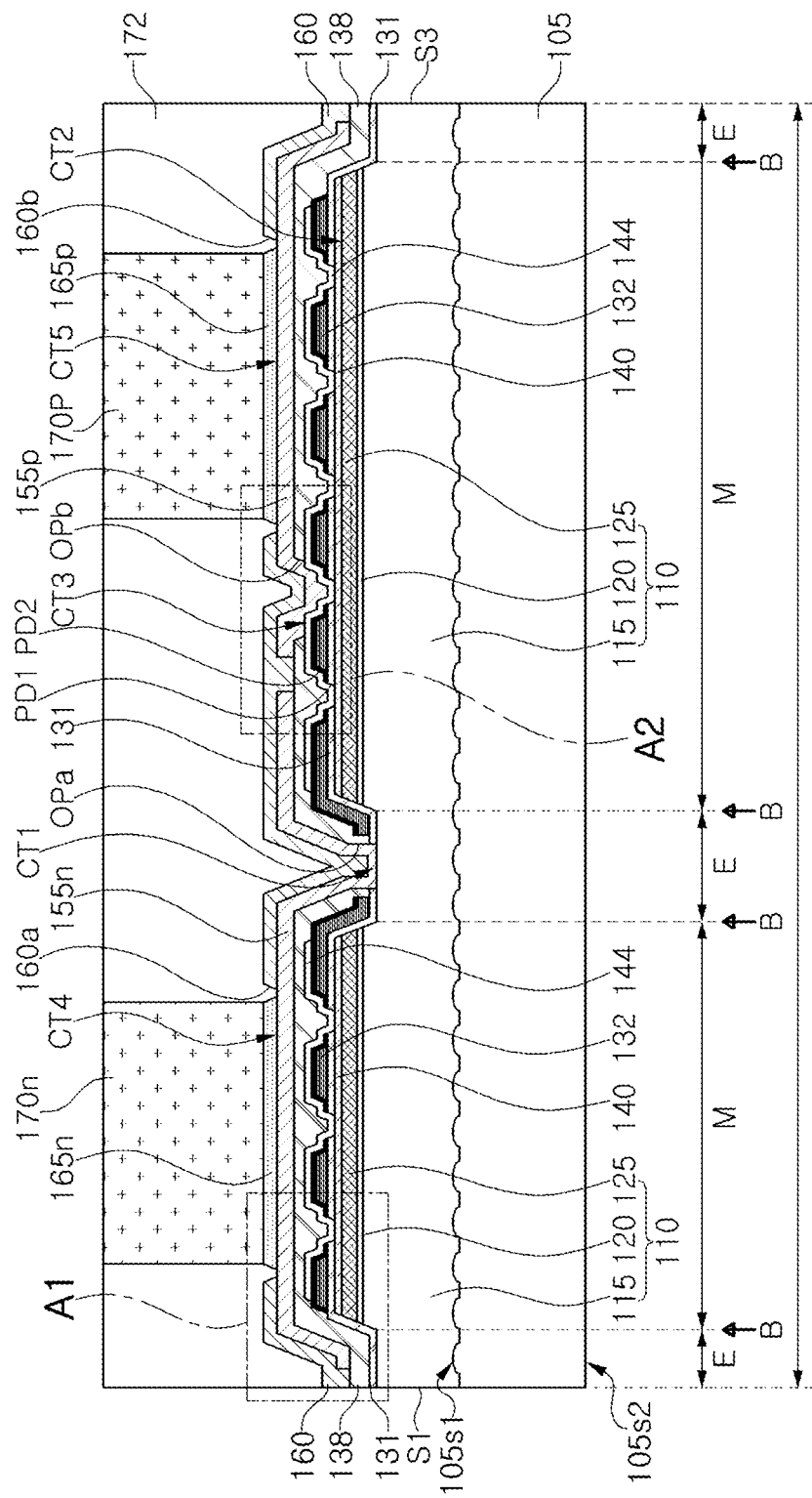
FIG. 2 is a side cross-sectional view of a semiconductor light emitting device of FIG. 1, taken along line I-I'.
Figure 3:
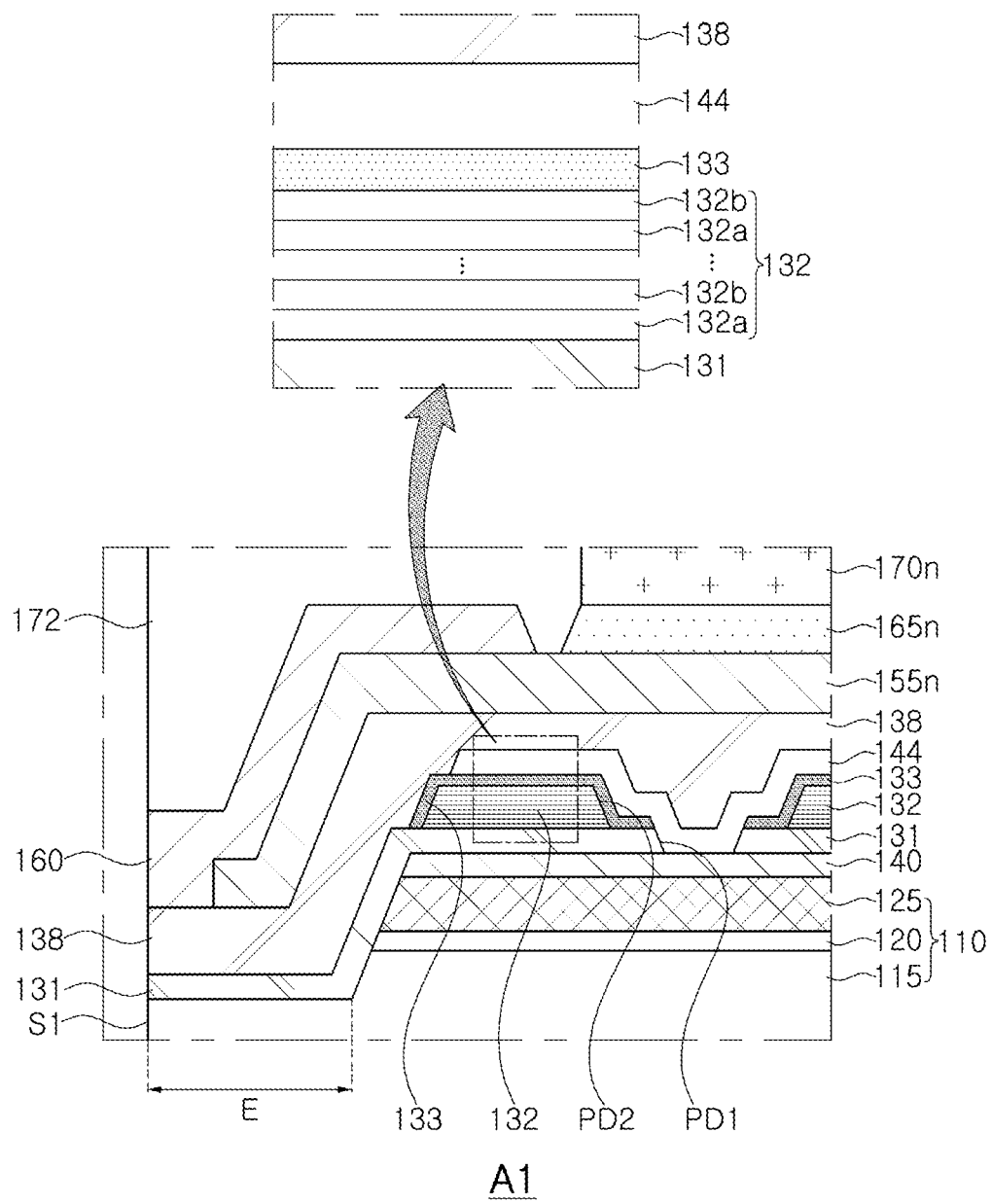
FIG. 3 is an enlarged view of a portion A1 of FIG. 2.
Figure 4:
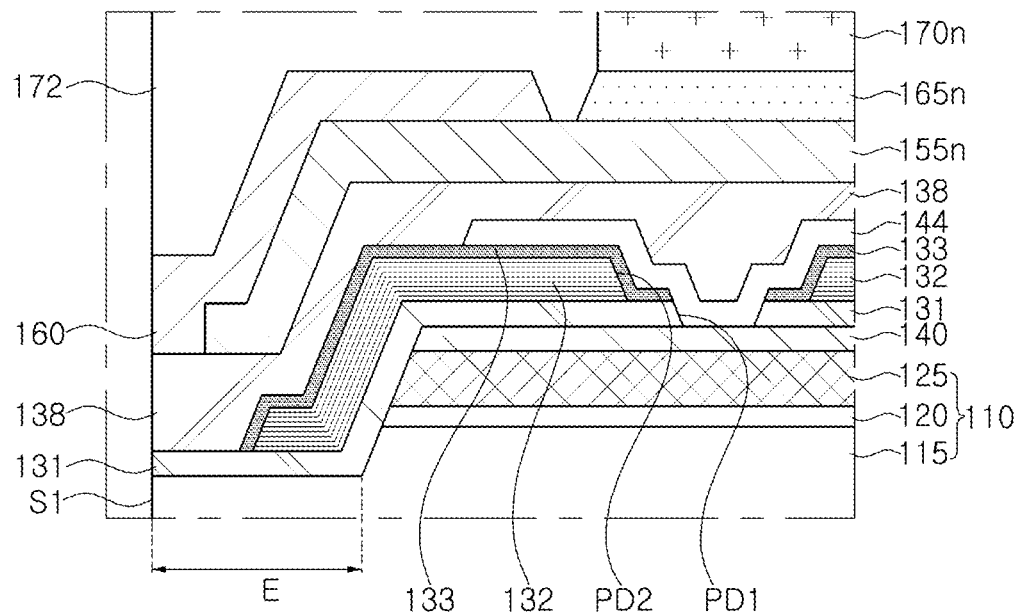
FIG. 4 is a modified example of FIG. 3.
Figure 5:
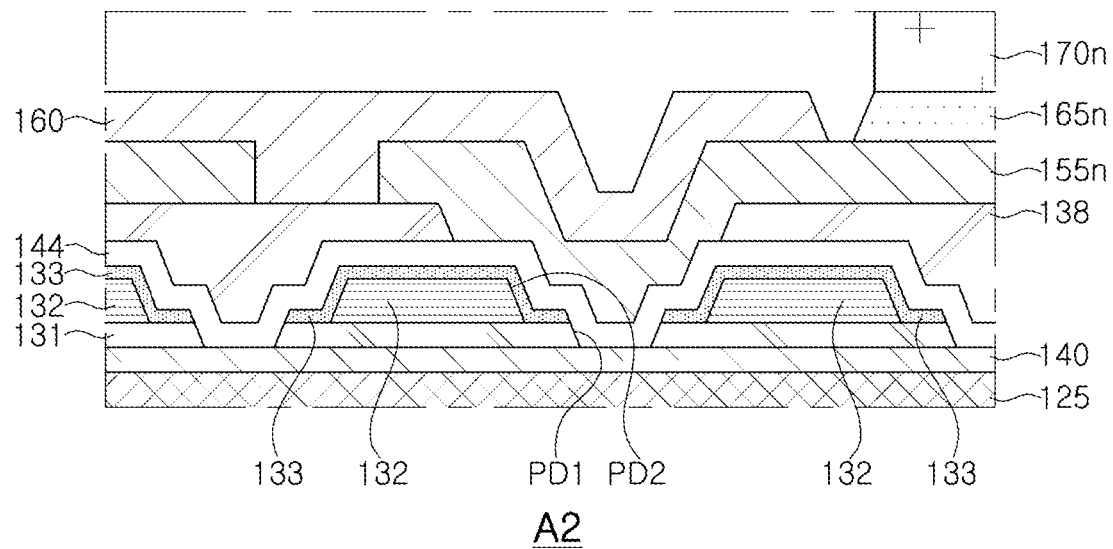
FIG. 5 is an enlarged view of a portion A2 of FIG. 2.

Referring to FIGS. 1 and 2, the semiconductor light emitting device 10 according to an exemplary embodiment may include a substrate 105, a light emitting structure 110, a first insulating layer 131, a multilayer insulating structure 132, a second insulating layer 133, a third insulating layer 138, a fourth insulating layer 160, a transparent electrode layer 140, a reflective electrode layer 144, a first connection electrode 155*n*, a second connection electrode 155*p*, a first electrode pad 165*n*, a second electrode pad 165*p*, a first solder pillar 170*n*, and a second solder pillar 170*p*.

The substrate 105 may have a front surface 105s1 and a rear surface 105s2 positioned opposite to the front surface 105s1. The substrate 105 may be a semiconductor growth substrate and may use or include an insulating, conductive, semiconductor material, e.g., sapphire, Si, SiC, $MgAl_2O_4$, MgO, $LiAlO_2$, $LiGaO_2$, GaN, or the like. Sapphire may have electrical insulating properties, may be a crystal having hexa-Rhombo R3c symmetry, and may be used as a substrate for nitride semiconductor growth. As used herein, the term "or" is not an exclusive term, e.g., "A or B" would include A, B, or A and B.

Throughout the specification, terms such as "front surface" and "rear surface" are used to distinguish between relative positions of components, and the instant application is not limited by these terms. Accordingly, these terms such as "front surface" and "rear surface" may be replaced with other terms, e.g., terms such as "first surface" and "second surface", or terms such as "upper surface" and "lower surface", and the like to be used to describe components of the disclosure. Therefore, the terms front surface 105s1 and rear surface 105s2 of the substrate 105 may be replaced with an upper surface 105s1 and a lower surface 105s2 of the substrate 105 or may be replaced with a first surface 105s1 and a second surface 105s2 of the substrate 105 so as to be used.

The light emitting structure 110 may be on the front surface 105s1 of the substrate 105.

In an implementation, the front surface 105s1 of the substrate 105 may have a concave-convex structure, and the concave-convex structure may help improve crystallinity and light emission efficiency of semiconductor layers of the light emitting structure 110. In an implementation, as illustrated in the drawings, the concave-convex structure of the front surface 105s1 of the substrate 105 may have a dome-shaped convex shape. In an implementation, the concave-convex structure of the front surface 105s1 of the substrate 105 may be formed to have various cross-sectional shapes such as a quadrangle or a triangle. In an implementation, the concave-convex structure of the front surface 105s1 of the substrate 105 may be selectively formed or may be omitted.

In an implementation, the substrate 105 may be removed later depending on an application. In an implementation, after being provided as a growth substrate for growing the light emitting structure 110, the substrate 105 may be removed through a separation process. The substrate 105 may be separated from the light emitting structure 110 through laser lift-off (LLO), chemical lift-off (CLO), or the like.

In an implementation, a buffer layer may be further provided on the front surface 105s1 of the substrate 105. The buffer layer may be for alleviating lattice defects of the semiconductor layer grown on the substrate 105 and may be formed as an undoped semiconductor layer formed of nitride or the like. The buffer layer may be formed of undoped GaN, AlN, InGaN, or the like, and may be grown to be formed with a thickness of several tens to hundreds of A at a low temperature of 500° C. to 600° C. Here, undoped means that the semiconductor layer does not undergo an impurity doping process separately. In an implementation, such a buffer layer may be omitted.

The light emitting structure 110 may include a first conductivity-type semiconductor layer 115, an active layer 120, and a second conductivity-type semiconductor layer 125.

The first conductivity-type semiconductor layer 115 may be grown from the front surface 105s1 of the substrate 105. The first conductivity-type semiconductor layer 115 may be formed of a semiconductor doped with an N-type impurity, and may be an N-type nitride semiconductor layer.

In plan view, the first conductivity-type semiconductor layer 115 may have a quadrangular shape. The first conductivity-type semiconductor layer 115 may have a first edge S1, a second edge S2, a third edge S3, and a fourth edge S4. In an implementation, the first and third edges S1 and S3 may be positioned on opposite surfaces, and the second and fourth edges S2 and S4 may be positioned on opposite surfaces.

The second conductivity-type semiconductor layer 125 may be formed of a semiconductor doped with a P-type impurity, and may be a P-type nitride semiconductor layer.

In an implementation, the first and second conductivity-type semiconductor layers 115 and 125 may be interchanged and stacked according to an embodiment. The first and second conductivity-type semiconductor layers 115 and 125 may have a composition of $Al_xIn_yGa_{(1-x-y)}N$ (in which $0 \le x < 1$, $0 \le y < 1$, $0 \le x+y < 1$), which may correspond to a material such as GaN, AlGaN, InGaN, or AlInGaN.

The active layer 120 may be between the first and second conductivity-type semiconductor layers 115 and 125. The active layer 120 may emit light having a predetermined energy by the recombination of electrons and holes during an operation of the semiconductor light emitting device 10. The active layer 120 may include a material having an energy band gap smaller than that of the first and second conductivity-type semiconductor layers 115 and 125. In an implementation, when the first and second conductivity-type semiconductor layers 115 and 125 are GaN-based compound semiconductors, the active layer 120 may include an InGaN-based compound semiconductor having an energy band gap smaller than that of GaN. In an implementation, the active layer 120 may have a multi-quantum well (MQW) structure in which quantum well layers and quantum barrier layers are alternately stacked with each other, e.g., an InGaN/GaN structure. In an implementation, a single quantum well (SQW) structure may be used in the active layer 120.

The light emitting structure 110 may include a recess region E in which the second conductivity-type semiconductor layer 125, the active layer 120, and the portion of the first conductivity-type semiconductor layer 115 are etched, and a mesa region M around the recess region E. In the drawings, reference numeral "B" may indicate a boundary B between the recess region E and the mesa region M. An upper surface of the mesa region M may be higher than an upper surface of the recess region E. In an implementation, the mesa region M may have a shape that is gradually narrowed from the bottom to the top. Accordingly, the mesa region M may have an inclined side surface.

In an implementation, a portion of an upper surface of the recess region E may be defined as a first contact region CT1. In an implementation, at least a portion of the upper surface of the mesa region M may be defined as a second contact region CT2.

The mesa region M may be spaced apart from the first to fourth edges S1 to S4, and the recess region E may be between the mesa region M and the first to fourth edges S1 to S4. In an implementation, circular recessed regions E spaced apart from each other may be further disposed in a central portion of the light emitting structure 110.

The transparent electrode layer 140 may be on the second conductivity-type semiconductor layer 125 of the light emitting structure 110. The transparent electrode layer 140 may be on the second contact region CT2 of the second conductivity-type semiconductor layer 125 and electrically connected to the second conductivity-type semiconductor layer 125. The transparent electrode layer 140 may include, e.g., indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, or $Zn_{(1-x)}Mg_xO$ (zinc magnesium oxide, in which 0≤x≤1).

The first insulating layer 131 may be on the transparent electrode layer 140. The first insulating layer 131 may cover a portion of the first conductivity-type semiconductor layer 115 and a portion of the second conductivity-type semiconductor layer 125. The first insulating layer 131 may include a plurality of first through-holes PD1 on the mesa region M. The first insulating layer 131 may partially cover the transparent electrode layer 140 on the mesa region M. In an implementation, as illustrated in the drawings, the plurality of first through-holes PD1 may be arranged in a honeycomb structure. In an implementation, the plurality of first through-holes PD1 may be in various forms such as a rectangular grid structure. In an implementation, as illustrated in the drawings, the plurality of first through-holes PD1 may have a circular cross-section. In an implementation, the plurality of first through-holes PD1 may have a polygonal or ring-shaped cross-section.

In an implementation, the transparent electrode layer 140 may have a plurality of through-holes arranged to stagger with respect to the plurality of first through-holes PD1. In this case, the first insulating layer 131 may fill the plurality of through-holes of the transparent electrode layer 140.

The first insulating layer 131 may include, e.g., silicon oxide or silicon nitride and may be formed of, e.g., $SiO_2$, SiN, $SiO_xN_y$, $Si_3N_4$, or the like. The first insulating layer 131 may help improve adhesion of the multilayer insulating structure 132.

Referring to FIGS. 1 to 4, the multilayer insulating structure 132 may be on the first insulating layer 131 to cover the light emitting structure 100. The multilayer insulating structure 132 may cover or be on the mesa region M on the first insulating layer 131. In an implementation, the multilayer insulating structure 132 may extend from an upper surface of the mesa region M to cover an inclined side surface of the mesa region M (refer to FIG. 4).

The multilayer insulating structure 132 may include a plurality of second through-holes PD2 on the mesa region M. The plurality of second through-holes PD2 may respectively overlap the plurality of first through-holes PD1, on which the first insulating layer 131 is disposed. In an implementation, the reflective electrode layer 144 on the multilayer insulating structure 132 may be connected to the transparent electrode layer 140 through the plurality of first through-holes PD1 and the plurality of second through-holes PD2.

The multilayer insulating structure 132 may be a reflective structure for reflecting light, which moves in the opposite direction after being emitted from the active layer 120, so as to be redirected toward the substrate 105 (e.g., and out of the light-emitting device). The multilayer insulating structure 132 may have a structure in which a first insulating film 132a having a first refractive index and a second insulating film 132b having a second refractive index different from the first refractive index are alternately stacked. The multilayer insulating structure 132 may be provided as a distributed Bragg reflector (DBR) by appropriately adjusting the refractive indices and thicknesses of the first insulating film 132a and the second insulating film 132b. The multilayer insulating structure 132 may include silicon oxide or silicon nitride having insulating properties and light transmission properties, e.g., $SiO_2$, SiN, $SiO_xN_y$, $TiO_2$, $Si_3N_4$, $Al_2O_3$, TiN, AlN, $ZrO_2$, TiAlN, TiSiN, or the like. In an implementation, the multilayer insulating structure 132 may have a structure in which the first insulating film 132a formed of $SiO_2$ and the second insulating film 132b formed of $TiO_2$ are alternately stacked. A lower surface of the multilayer insulating structure 132 may be in contact with the first insulating layer 131, and an upper surface of the multilayer insulating structure 132 may be in contact with the second insulating layer 133. In an implementation, the first insulating film 132a formed of $SiO_2$ may be on or at the lower surface of the multilayer insulating structure 132, and the second insulating film 132b formed of $TiO_2$ may be on or at the upper surface of the multilayer insulating structure 132.

The multilayer insulating structure 132 may extend to the recess region E on the first insulating layer 131 such that the multilayer insulating structure 132 is not exposed to or at the side surface of the semiconductor light emitting device 10. If the multilayer insulating structure 132 were to be exposed at the side surface of the semiconductor light emitting device 10, undesirable peeling could occur from or at the multilayer insulating structure 132, e.g., due to infiltration of moisture, thereby reducing reliability of the semiconductor light emitting device 10. In an implementation, the multilayer insulating structure 132 may not be exposed at the side surface of the semiconductor light emitting device 10, and the reliability of the semiconductor light emitting device 10 may be improved.

The second insulating layer 133 may be between the multilayer insulating structure 132 and the reflective electrode layer 144. Accordingly, direct contact between the multilayer insulating structure 132 and the reflective electrode layer 144 may be prevented. In an implementation, the second insulating layer 133 may at least partially cover upper and side surfaces of the multilayer insulating structure 132. In an implementation, the second insulating layer 133 may not be in or on a region of the multilayer insulating structure 132 not in direct contact with the reflective electrode layer 144. In an implementation, a portion of the second insulating layer 133 may extend to or onto an upper surface of the first insulating layer 131. The second insulating layer 133 may be formed of an insulating material to help ensure insulation between the multilayer insulating structure 132 and the reflective electrode layer 144. If $TiO_2$ is included in the multilayer insulating structure 132 and a metal material such as Ag is included in the reflective electrode layer 144, a metal element of the reflective electrode layer 144 could migrate to the multilayer insulating structure 132. The second insulating layer 133 may help suppress undesirable migration of the metal element of the reflective electrode layer 144 to the multilayer insulating structure 132.

The second insulating layer 133 may be formed of a material similar to that of the first insulating layer 131. The second insulating layer 133 may include silicon oxide or silicon nitride, e.g., $SiO_2$, SiN, $SiO_xN_y$, $Si_3N_4$, or the like.

The reflective electrode layer 144 may be on the multilayer insulating structure 132 and may be connected to the transparent electrode layer 140 through the plurality of first through-holes PD1 and the plurality of second through-holes PD2. The reflective electrode layer 144 may include, e.g., Ag, Cr, Ni, Ti, Al, Rh, Ru, or a combination thereof.

The third insulating layer 138 may cover the upper and side surfaces of the reflective electrode layer 144 to help protect the reflective electrode layer 144. In an implementation, the third insulating layer 138 may cover (e.g., directly contact) a portion of the first insulating layer 131 and a portion of the second insulating layer 133. In an implementation, the third insulating layer 138 may be in direct contact with the first insulating layer 131 in the recess region E, at the edge of the light emitting structure 110.

In the third insulating layer 138, a first opening OPa may penetrate through the first insulating layer 131 and the third insulating layer 138 to expose the first contact region CT1 of the first conductivity-type semiconductor layer 115, and a second opening OPb may expose the third contact region CT3 of the reflective electrode layer 144. The first opening OPa may be in or on the recess region E, and the second opening OPb may be in or on the mesa region M.

The first connection electrode 155n may be on the third insulating layer 138 and may extend onto the first contact region CT1 of the first conductivity-type semiconductor layer 115 through the first opening OPa so as to be electrically connected to the first conductivity-type semiconductor layer 115. The first connection electrode 155n may contact the first contact region CT1 of the first conductivity-type semiconductor layer 115. In an implementation, in order to help improve contact resistance characteristics between the first connection electrode 155n and the first contact region CT1 of the first conductivity-type semiconductor layer 115, a conductive buffer layer may be between the first connection electrode 155n and the first contact region CT1 of the first conductivity-type semiconductor layer 115.

The second connection electrode 155p may be on the third insulating layer 138 and may extend onto the third contact region CT3 of the reflective electrode layer 144 through the second opening OPb so as to be electrically connected to the reflective electrode layer 144. Accordingly, the second connection electrode 155p may be electrically connected to the second conductivity-type semiconductor layer 125 through the reflective electrode layer 144.

The first connection electrode 155n and the second connection electrode 155p may be on the third insulating layer 138, may be formed of the same material, and may be spaced apart from each other. In an implementation, the first connection electrode 155n and the second connection electrode 155p may each be formed of a material including, e.g., Al, Au, W, Pt, Si, Ir, Ag, Cu, Ni, Ti, Cr, or alloys thereof.

In plan view, the first connection electrode 155n may be adjacent to the first edge S1, and the second connection electrode 155p may be adjacent to the third edge S3.

The fourth insulating layer 160 may have a third opening 160a on the first connection electrode 155n and exposing a fourth contact region CT4 of the first connection electrode 155n and a fourth opening 160b on the second connection electrode 155p and exposing a fifth contact region CT5 of the second connection electrode 155p.

A first electrode pad 165n may be on the fourth contact region CT4 of the first connection electrode 155n and a second electrode pad 165p may be on the fifth contact region CT5 of the second connection electrode 155p. A first solder pillar 170n may be on the first electrode pad 165n, and a second solder pillar 170p may be on the second electrode pad 165p. The first and second solder pillars 170n and 170p may each be formed of a conductive material, e.g., Sn or AuSn.

A molding portion 172 may cover side surfaces of the first and second solder pillars 170n and 170p. The molding portion 172 may include a light reflective powder, e.g., $TiO_2$, $Al_2O_3$, or the like. In an implementation, an upper surface of the molding portion 172 may be lower than upper surfaces of the first and second solder pillars 170n and 170p.

Next, an example of a method of manufacturing the semiconductor light emitting device 10 according to an embodiment is described with reference to FIGS. 6 to 19. FIGS. 6, 8, 10, 12, 14, 16, and 18 are schematic plan views of stages in a method of manufacturing a semiconductor light emitting device 10 according to an embodiment, and FIGS. 7, 9, 11, 13, 15, 17, and 19 are schematic cross-sectional views taken along line I-I' of FIGS. 6, 8, 10, 12, 14, 16, and 18, respectively.

Figure 6:
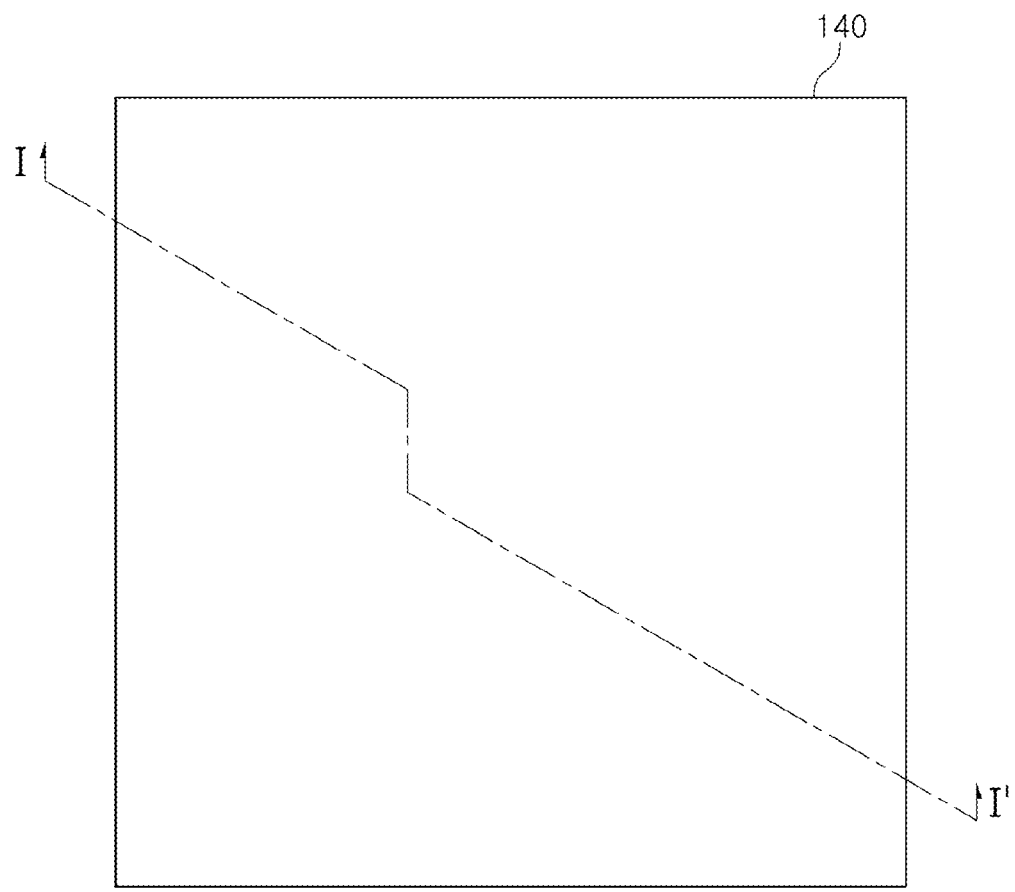
FIGS. 6 to 19 are views of stages in a manufacturing process of the semiconductor light emitting device of FIG. 2.
Figure 7:
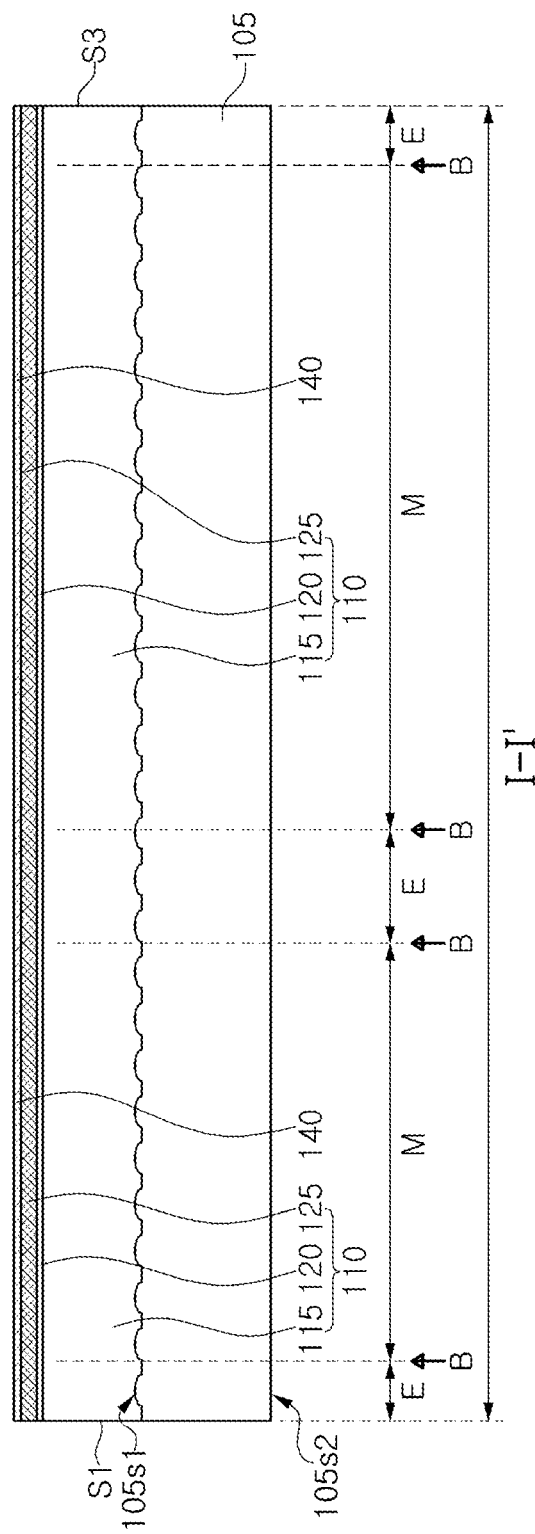

Referring to FIGS. 6 and 7, the light emitting structure 110 may be formed on a substrate 105. The substrate 105 may be formed of a material, e.g., sapphire, Si, SiC, $MgAl_2O_4$, MgO, $LiAlO_2$, $LiGaO_2$, or GaN. The substrate 105 may have a front surface 105s1 and a rear surface 105s2 positioned opposite to the front surface 105s1.

In an implementation, a concave-convex structure may be formed on the front surface 105s1 of the substrate 105. In an implementation, the concave-convex structure of the front surface 105s1 of the substrate 105 may be omitted.

The light emitting structure 110 may be formed on the front surface 105s1 of the substrate 105. The light emitting structure 110 may be formed as a plurality of layers using a process, e.g., metal organic chemical vapor deposition (MOCVD), hydride vapor phase epitaxy (HVPE), molecular beam epitaxy (MBE), or the like. In an implementation, the light emitting structure 110 may include a first conductivity-type semiconductor layer 115, the active layer 120, and the second conductivity-type semiconductor layer 125 sequentially formed on the front surface 105s1 of the substrate 105. The first conductivity-type semiconductor layer 115 and the second conductivity-type semiconductor layer 125 may have different conductivity types. In an implementation, the first conductivity-type semiconductor layer 115 may have an N-type conductivity type, and the second conductivity-type semiconductor layer 125 may have a P-type conductivity type.

In an implementation, the transparent electrode layer 140 may be formed on the light emitting structure 110.

Figure 8:
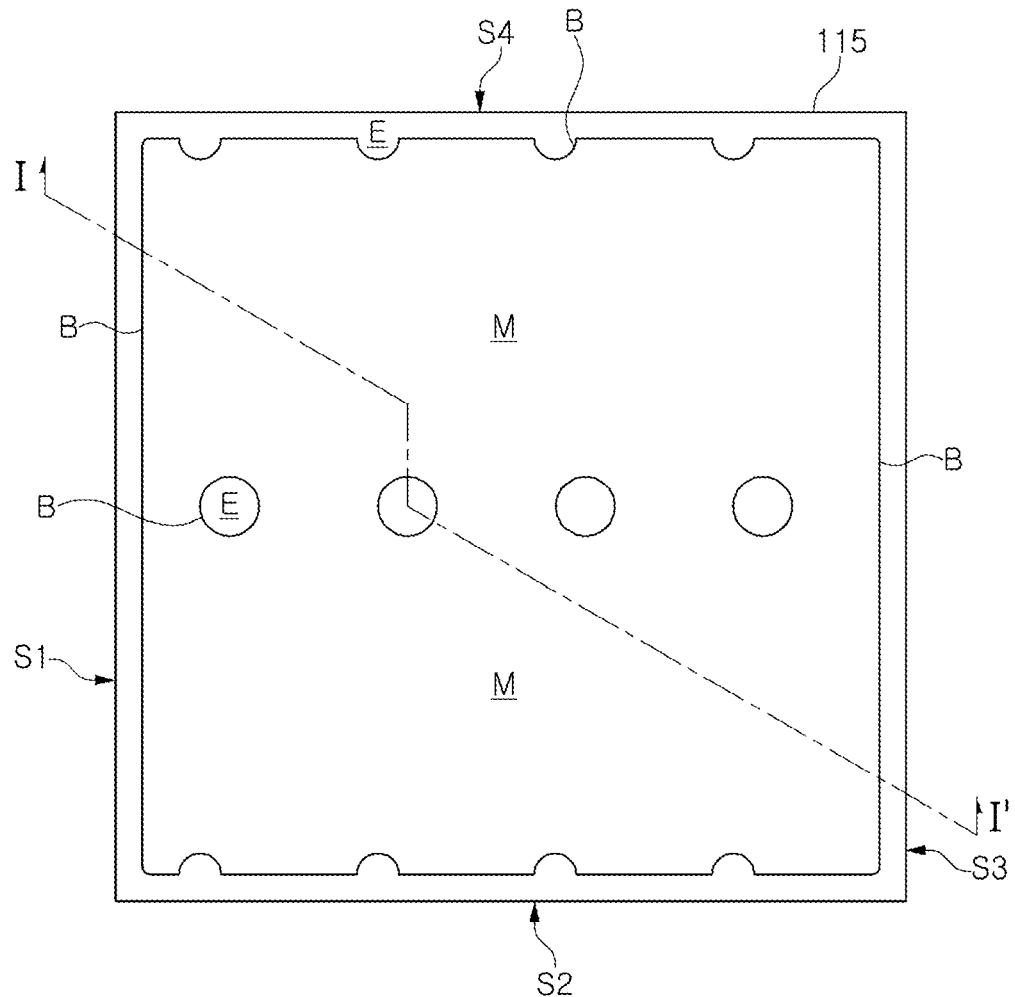
Figure 9:
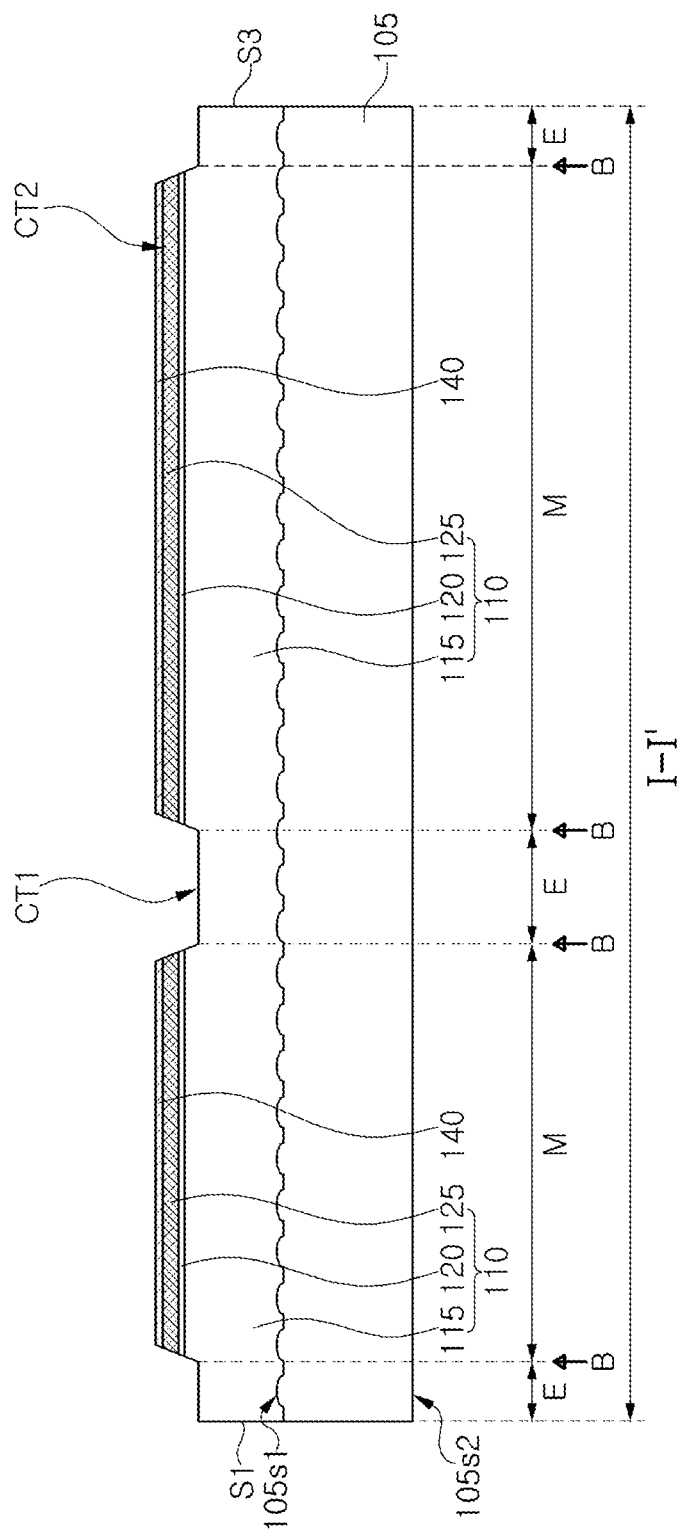

Referring to FIGS. 8 and 9, the transparent electrode layer 140, the second conductivity-type semiconductor layer 125, the active layer 120, and the portion of the first conductivity-type semiconductor layer 115 may be etched using photolithography. In an implementation, the light emitting structure 110 may include a recess region E (in which the second conductivity-type semiconductor layer 125, the active layer 120, and the portion of the first conductivity-type semiconductor layer 115 have been removed) and a mesa region M (surrounding the recess region E). The mesa region M may be defined as a region in which the second conductivity-type semiconductor layer 125, the active layer 120, and the first conductivity-type semiconductor layer 115 have not been etched or removed. The mesa region M may have a relatively protruding shape compared to the recess region E. The recess region E may also be referred to as an etched region.

Figure 10:
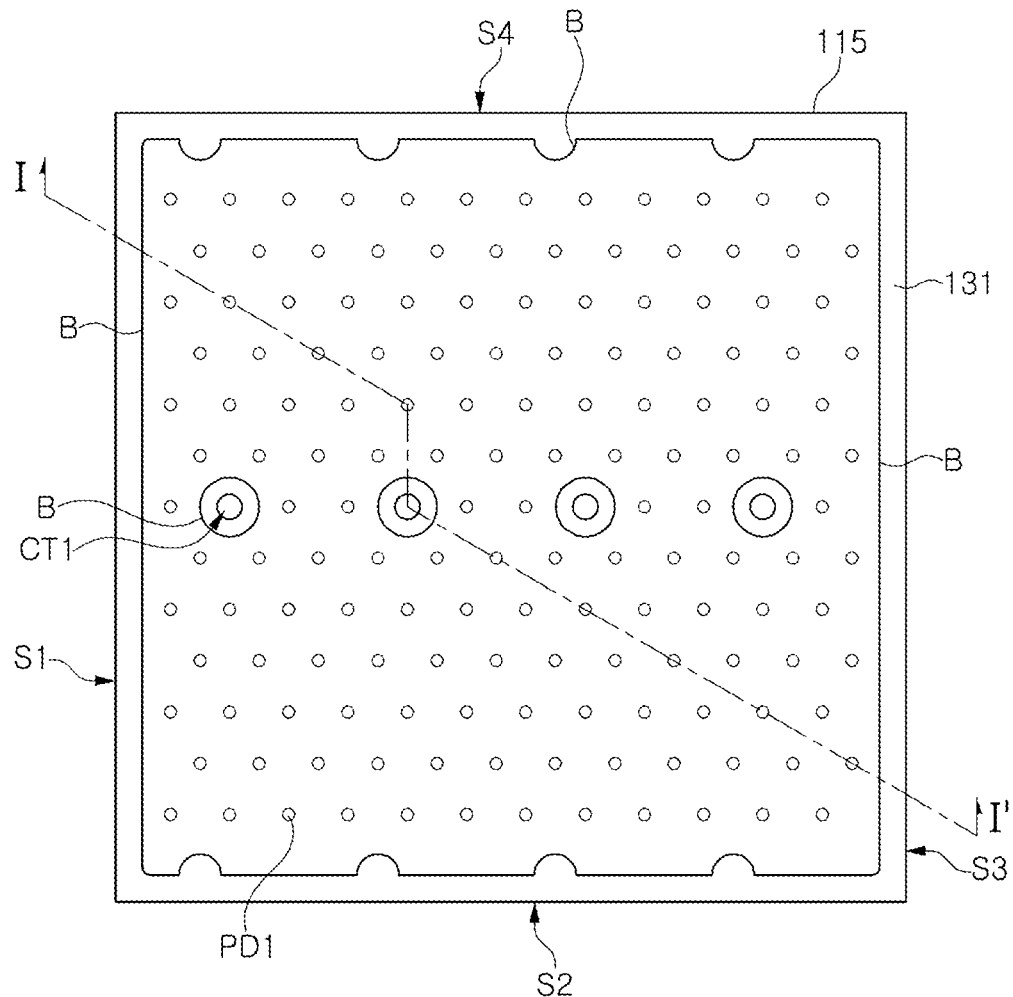
Figure 11:
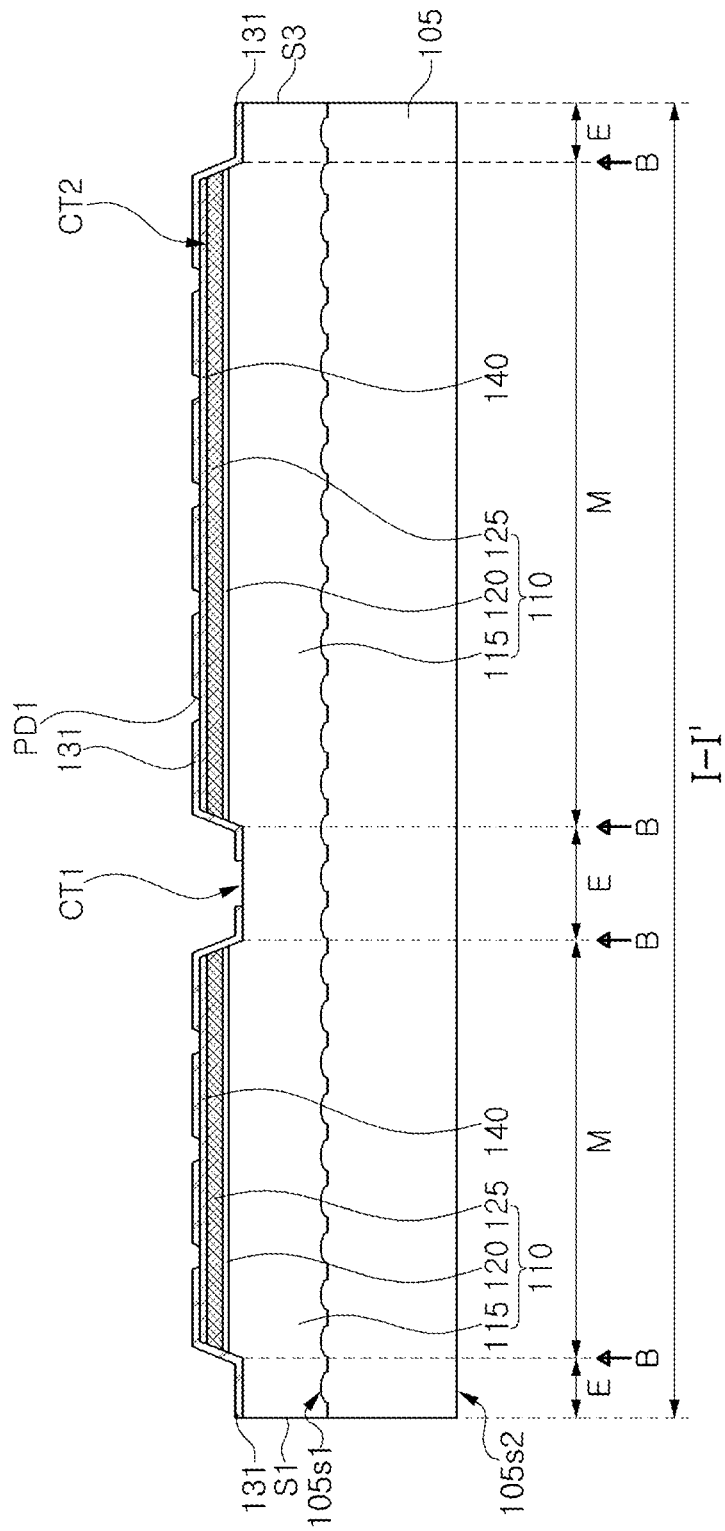

Referring to FIGS. 10 and 11, a first insulating layer 131 having a plurality of first through-holes PD1 may be formed on the light emitting structure 110.

The plurality of first through-holes PD1 of the first insulating layer 131 may expose a portion of the transparent electrode layer 140. The plurality of first through-holes PD1 may be on the mesa region M.

Figure 12:
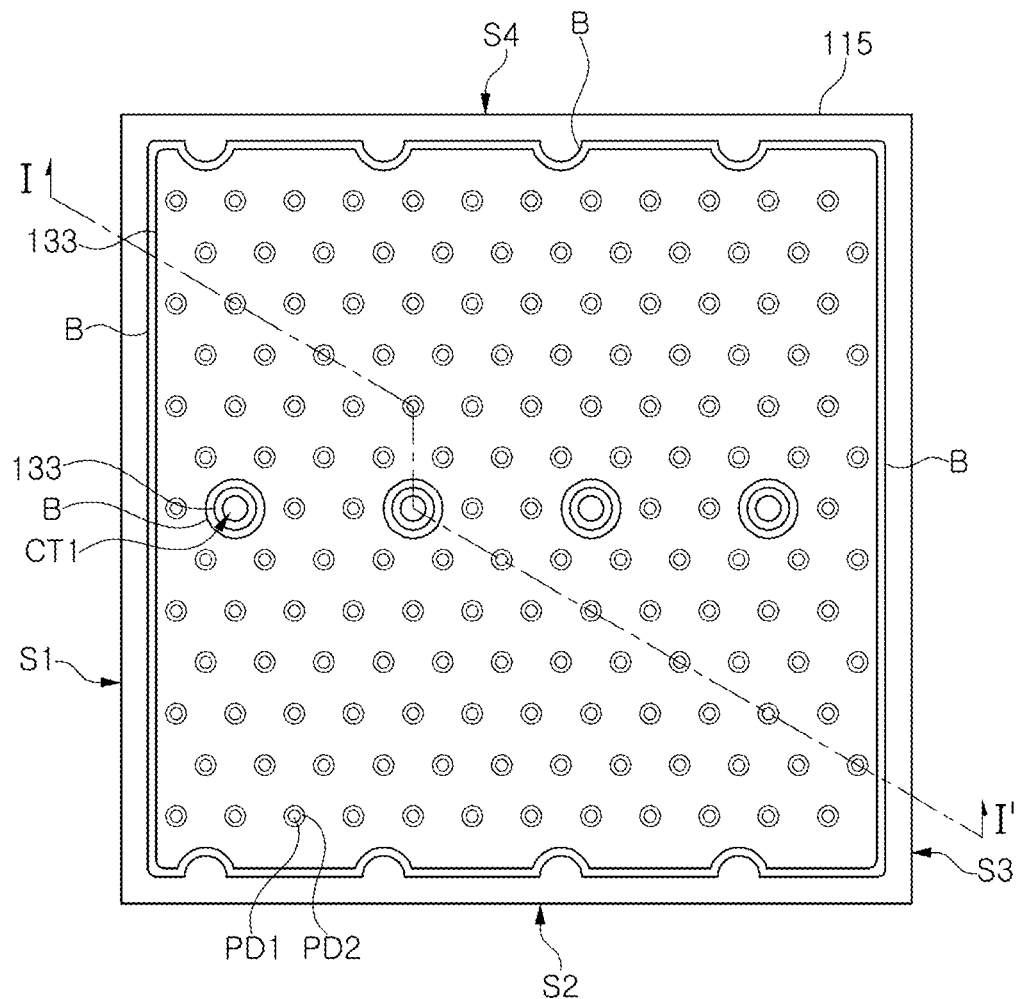
Figure 13:
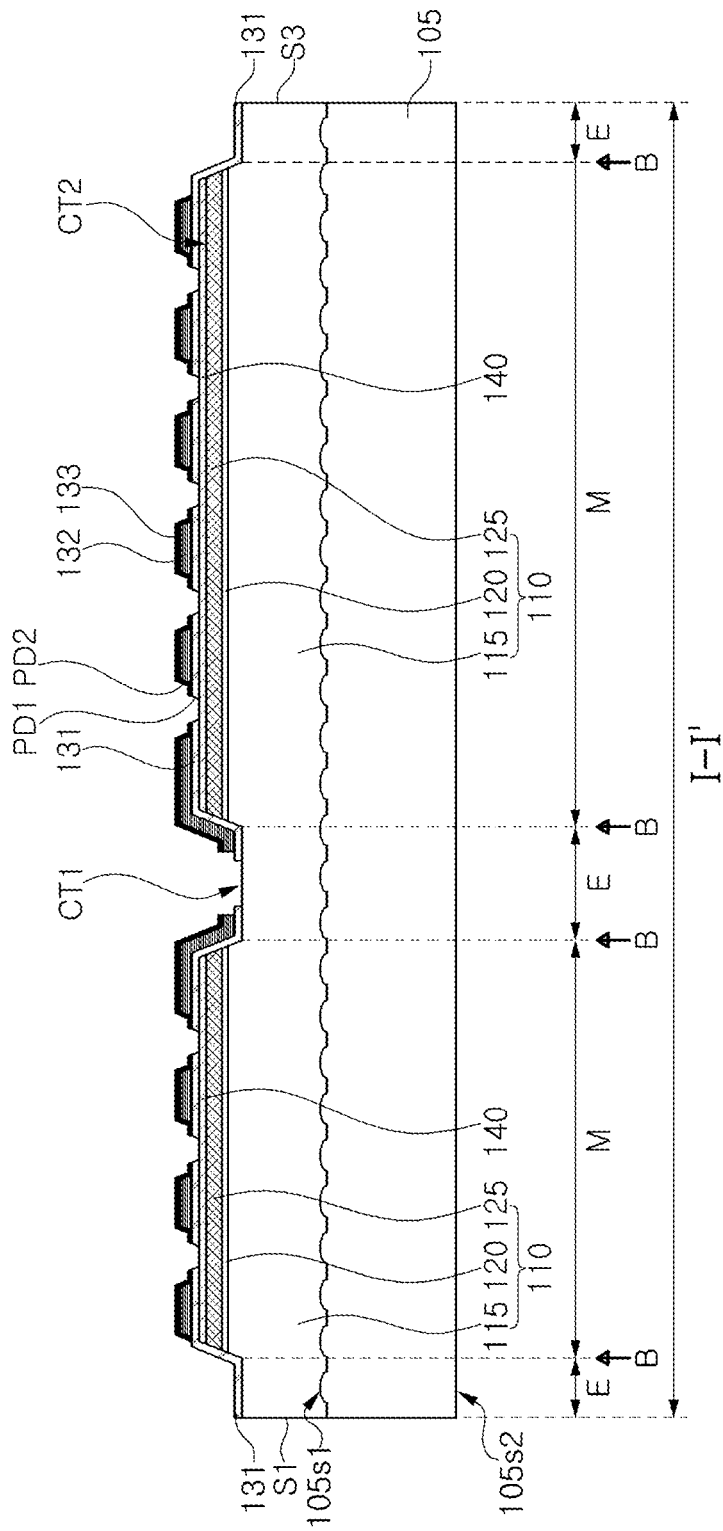

Referring to FIGS. 12 and 13, a multilayer insulating structure 132 having a plurality of second through-holes PD2 may be formed on the first insulating layer 131.

The multilayer insulating structure 132 may include silicon oxide or silicon nitride and may be formed by repeatedly depositing a material, e.g., $SiO_2$, SiN, $SiO_xN_y$, $TiO_2$, $Si_3N_4$, $Al_2O_3$, TiN, AlN, $ZrO_2$, TiAlN, TiSiN, or the like. Such a process may be performed using a process, e.g., MOCVD, HVPE, MBE, or the like.

The multilayer insulating structure 132 may have a structure in which insulating films having different refractive indices are alternately stacked. In an implementation, the multilayer insulating structure 132 may be a structure in which a first insulating film 132a formed of $SiO_2$ and a second insulating film 132b formed of $TiO_2$ are alternately stacked. The multilayer insulating structure 132 may be provided as a distributed Bragg reflector (DBR) by appropriately adjusting or selecting the refractive indices and thicknesses of the alternately stacked layers.

The plurality of second through-holes PD2 may respectively correspond to (e.g., overlie or be in communication with) the plurality of first through-holes PD1. A size of each of the plurality of second through-holes PD2 may be larger than a size of each of the plurality of first through-holes PD1.

In an implementation, the second insulating layer 133 may be formed to cover upper and side surfaces of the multilayer insulating structure 132.

Figure 14:
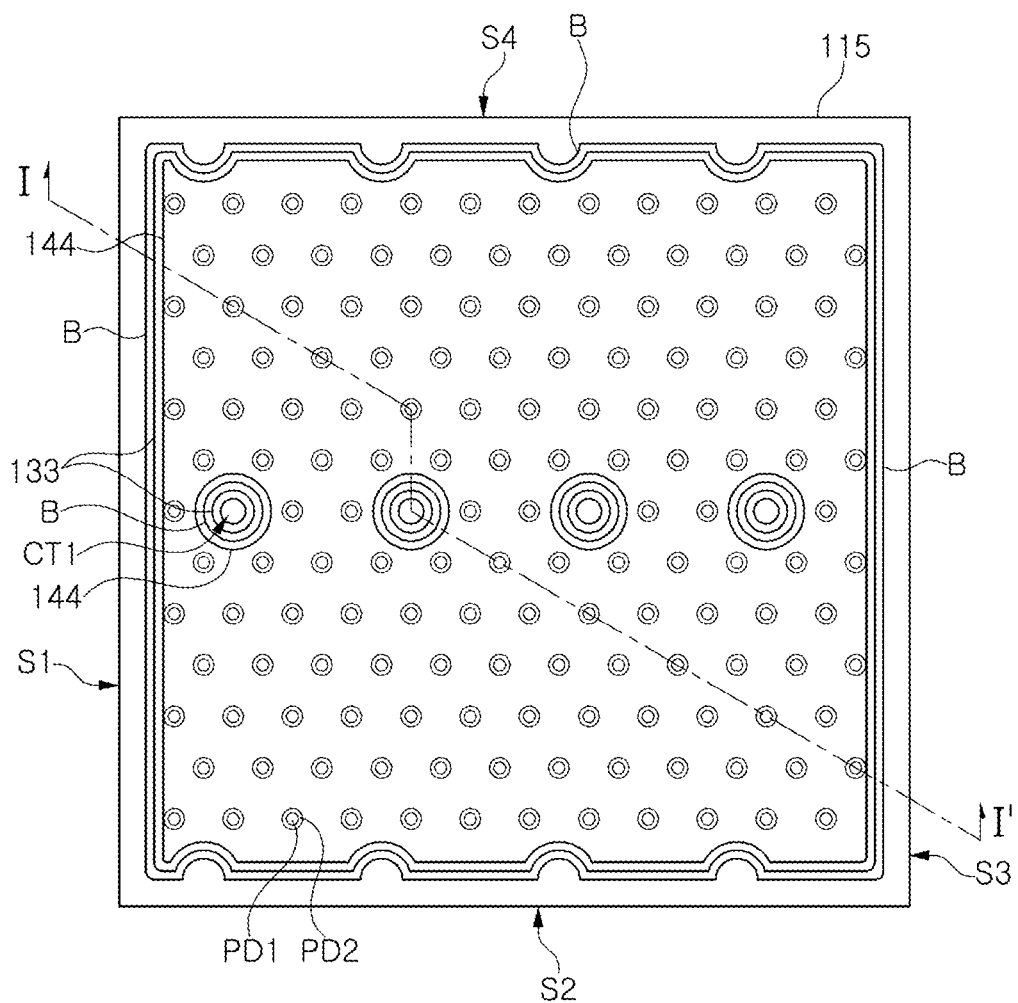
Figure 15:
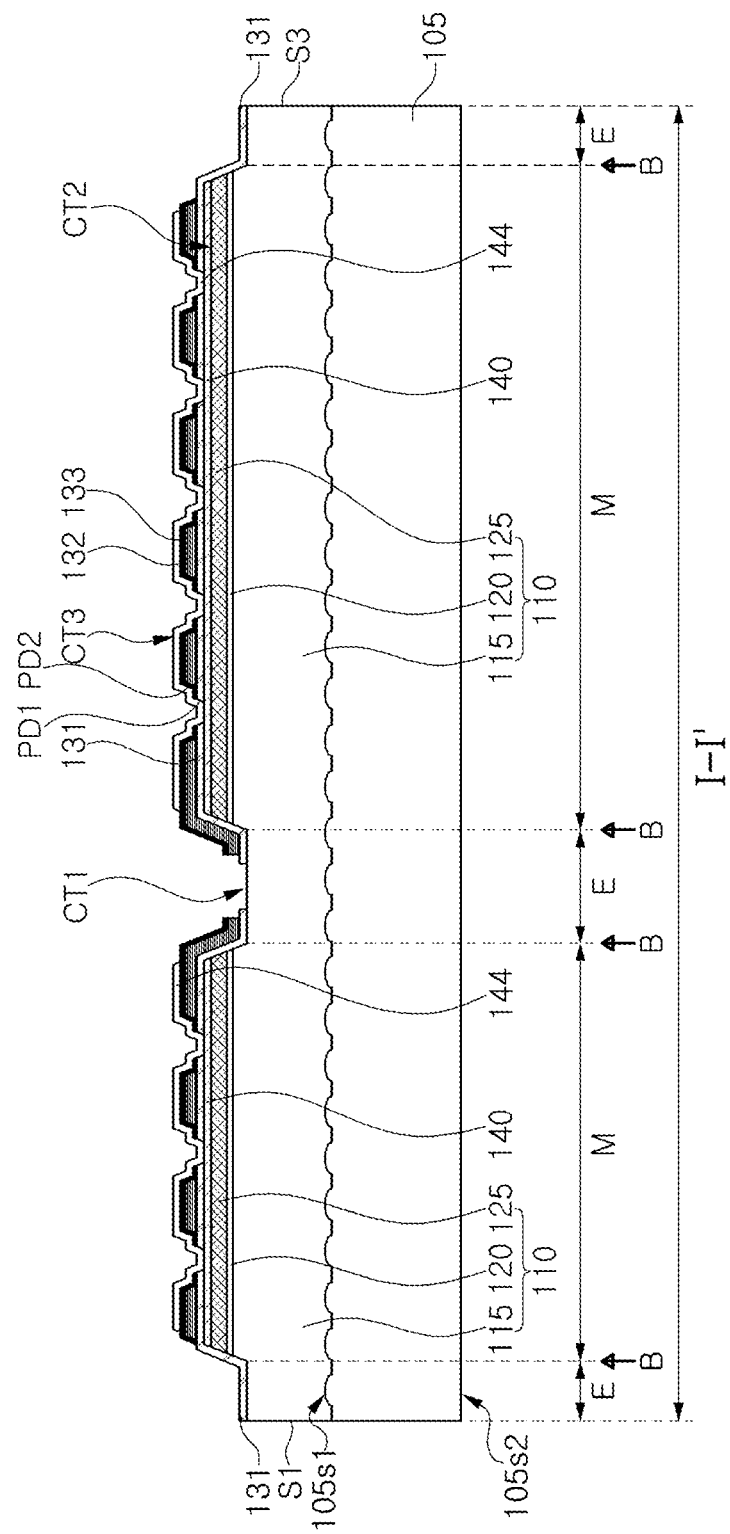

Referring to FIGS. 14 and 15, the reflective electrode layer 144 may be formed on the second insulating layer 133. The reflective electrode layer 144 may be formed on the mesa region M. The reflective electrode layer 144 may not directly contact the multilayer insulating structure 132, e.g., due to the second insulating layer 133 therebetween.

Figure 16:
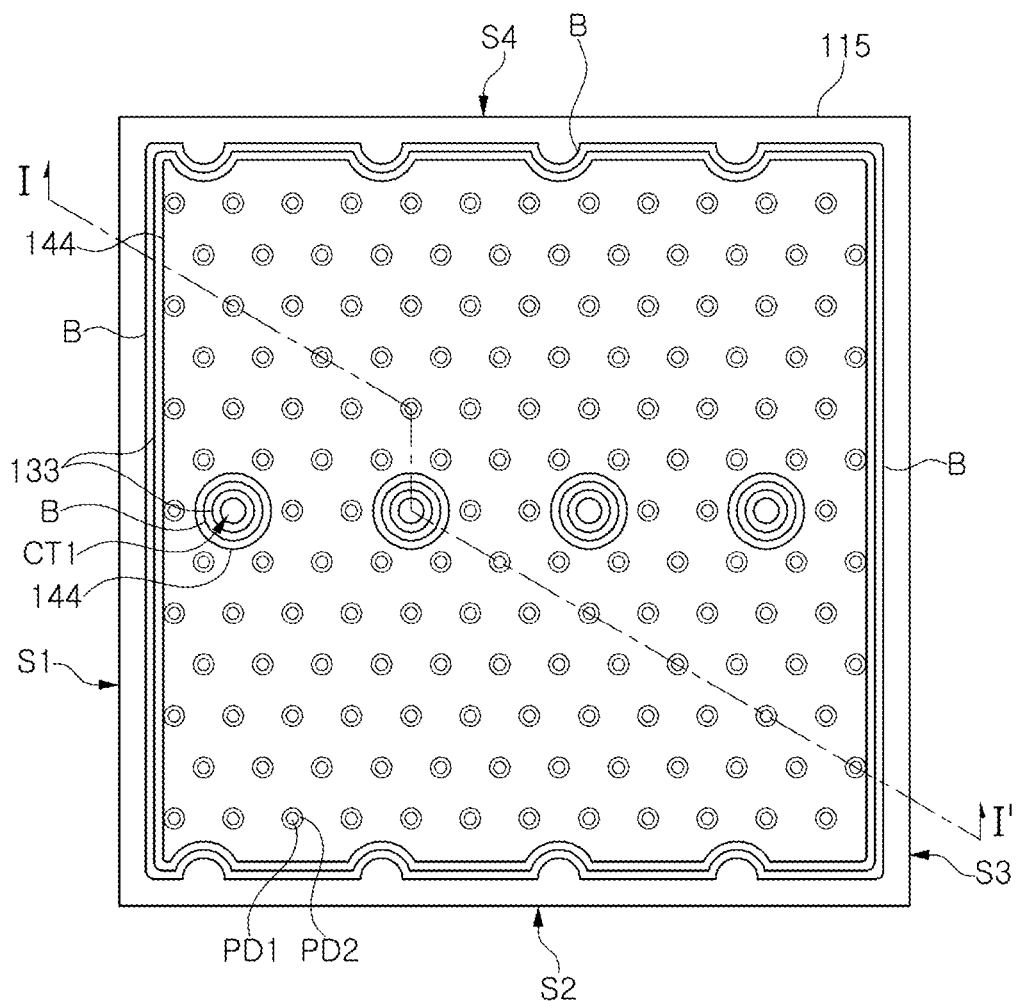
Figure 17:
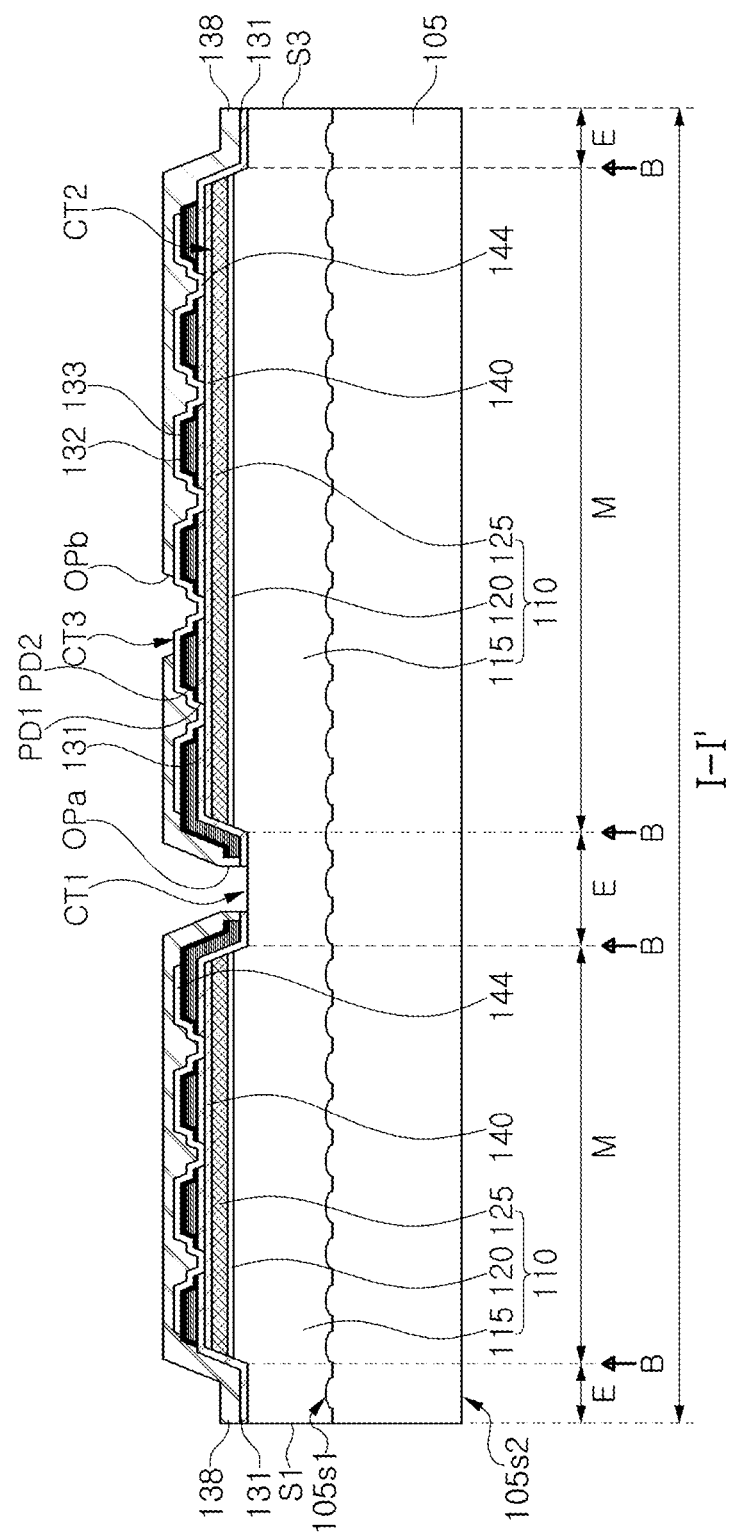

Referring to FIGS. 16 and 17, the third insulating layer 138 may be formed on the reflective electrode layer 144. The third insulating layer 138 may cover upper and side surfaces of the reflective electrode layer 144 and a portion of the first insulating layer 131. The third insulating layer 138 may cover a portion of the second insulating layer 133 adjacent to the reflective electrode layer 144. The third insulating layer 138 may be formed, e.g., by a physical vapor deposition process such as sputtering after forming a photoresist pattern exposing a region in which the third insulating layer 138 is to be formed.

The first opening OPa penetrating through the first insulating layer 131 and the third insulating layer 138 and exposing a portion of the first conductivity-type semiconductor layer 115 of the recess region E and the second opening OPb penetrating through the third insulating layer 138 and exposing a portion of the reflective electrode layer 144 of the mesa region M may be formed.

A surface of the first conductivity-type semiconductor layer 115 exposed by the first opening OPa may be referred to as the first contact region CT1 and a surface of the reflective electrode layer 144 exposed by the second opening OPb may be referred to as the third contact region CT3.

Figure 18:
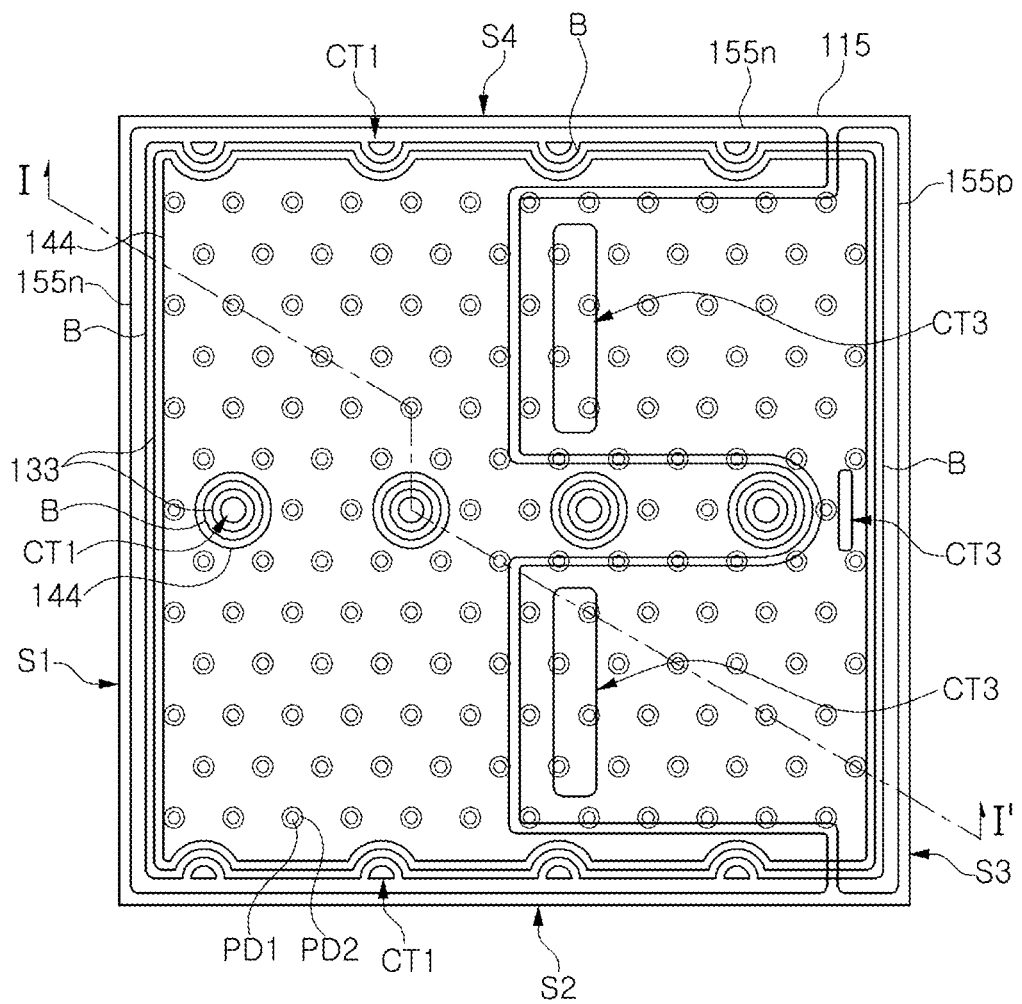
Figure 19:
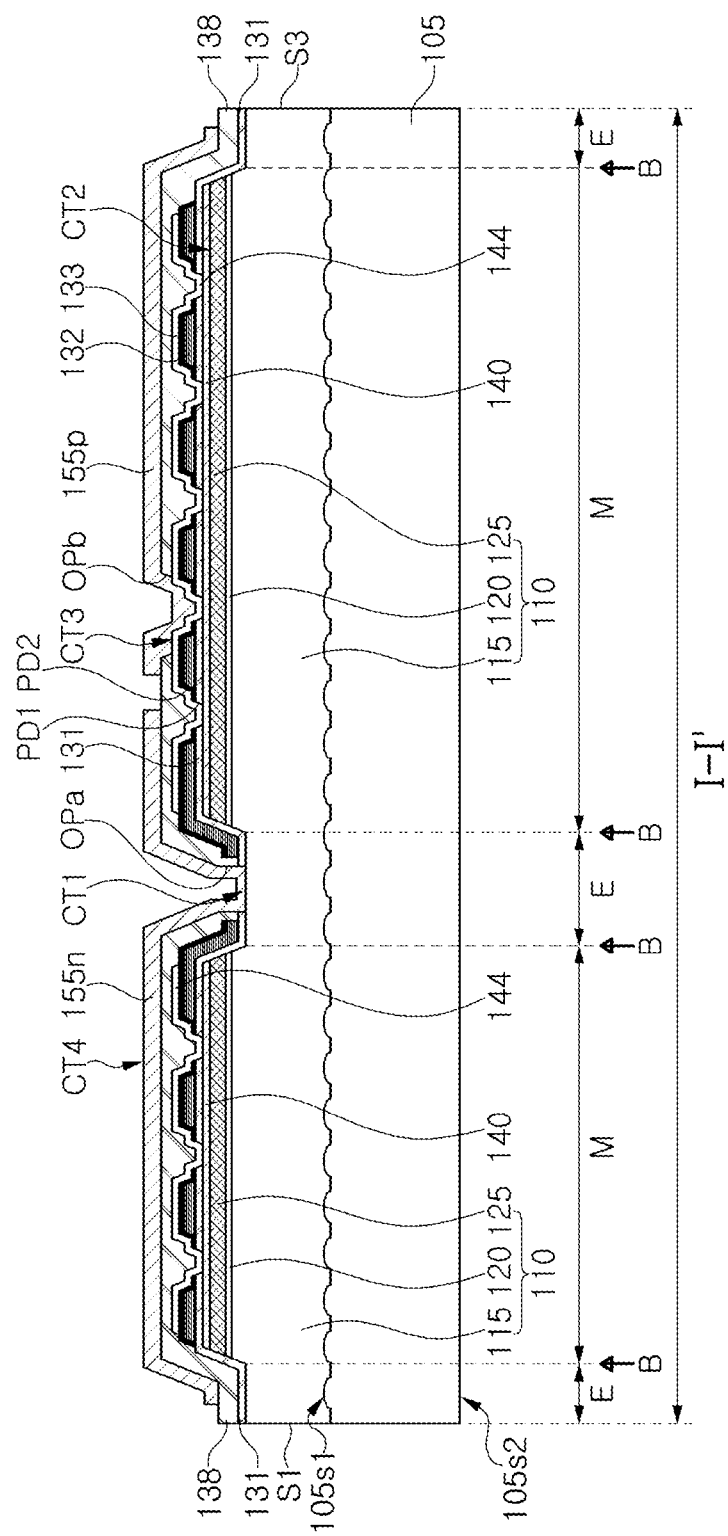

Referring to FIGS. 18 and 19, the first connection electrode 155n and the second connection electrode 155p may be formed on the substrate 105 having the third insulating layer 138.

Forming the first connection electrode 155n and the second connection electrode 155p may include forming a conductive material layer on the substrate 105 (having the third insulating layer 138 thereon), and etching a portion of the conductive material layer using photolithography. The first connection electrode 155n and the second connection electrode 155p may be formed through the same process, and the first connection electrode 155n and the second connection electrode 155p may be formed of the same material. The first connection electrode 155n and the second connection electrode 155p may be formed to have the same thickness.

The first connection electrode 155n may be electrically connected to the first contact region CT1 of the first conductivity-type semiconductor layer 115. The second connection electrode 155p may be electrically connected to the third contact region CT3 of the reflective electrode layer 144.

Referring back to FIGS. 1 and 2, the fourth insulating layer 160 having the third opening 160a and the fourth opening 160b may be formed on the substrate 105 having the first connection electrode 155n and the second connection electrode 155p.

The third opening 160a of the fourth insulating layer 160 may expose a partial region of the first connection electrode 155n, and the fourth opening 160b of the fourth insulating layer 160 may expose a partial region of the second connection electrode 155p.

The partial region of the second connection electrode 155p exposed by the third opening 160a of the fourth insulating layer 160 may be referred to as the fourth contact region CT4, and the partial region of the second connection electrode 155p exposed by the fourth opening 160b of the fourth insulating layer 160 may be referred to as the fifth contact region CT5.

First and second electrode pads 165n and 165p may be formed on the substrate 105 having the fourth insulating layer 160. The first electrode pad 165n may be formed on the fourth contact region CT4 of the first connection electrode 155n, and the second electrode pad 165p may be formed on the fifth contact region CT5 of the second connection electrode 155p. The first and second electrode pads 165n and 165p may be under bump metallurgy (UBM). In an implementation, the number and arrangement of the first and second electrode pads 165n and 165p may be variously modified.

The first and second solder pillars 170n and 170p may be formed on the substrate 105 having the first and second electrode pads 165n and 165p. In an implementation, a plurality of first and second solder pillars 170n and 170p may be formed. The first solder pillar 170n may be formed on the first electrode pad 165n, and the second solder pillar 170p may be formed on the second electrode pad 165p.

A molding portion 172 may be formed to cover side surfaces of the first and second solder pillars 170n and 170p. The molding portion 172 may include a light reflective powder, e.g., $TiO_2$, $Al_2O_3$, or the like.

Figure 20:
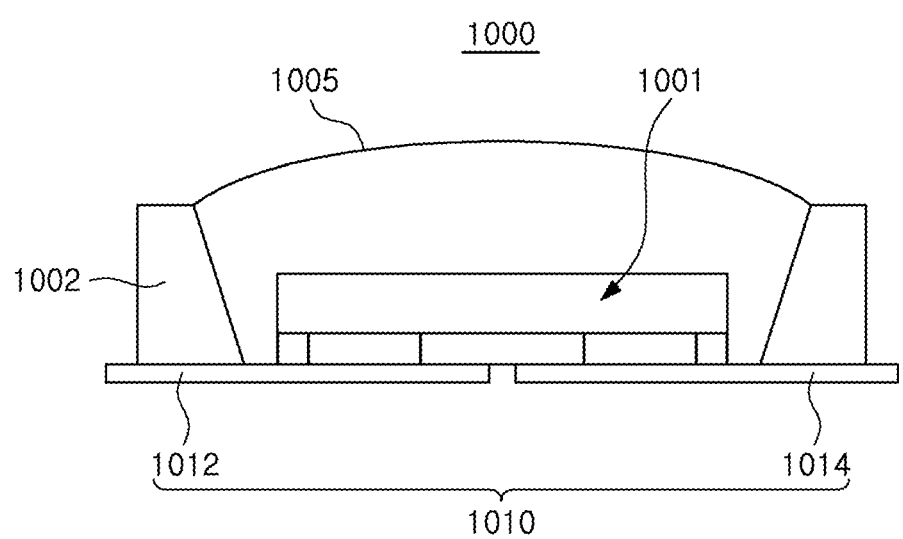
FIG. 20 is a side cross-sectional view of an example in which a semiconductor light emitting device according to an embodiment is applied to a semiconductor light emitting device package.

The semiconductor light emitting device 10 as described above may be commercialized in the form of a package. Hereinafter, an example in which the semiconductor light emitting device 10 as described above is applied to a package is described with reference to FIG. 20. FIG. 20 is a cross-sectional view schematically illustrating an example in which a semiconductor light emitting device according to an embodiment is applied to a package.

Referring to FIG. 20, a semiconductor light emitting device package 1000 may include a semiconductor light emitting device 1001 as a light source, a package body 1002, a pair of lead frames 1010, and an encapsulant 1005. Here, the semiconductor light emitting device 1001 may be the semiconductor light emitting device of FIGS. 1 to 4, and a description thereof may be omitted.

The semiconductor light emitting device 1001 may be mounted on the lead frames 1010 and may be electrically connected to the lead frames 1010.

The pair of lead frames 1010 may include a first lead frame 1012 and a second lead frame 1014. In an implementation, referring to FIG. 2, the semiconductor light emitting device 1001 may be connected to the first lead frame 1012 and the second lead frame 1014 by the first and second solder pillars 170*n* and 170*p*.

The package body 1002 may include a reflective cup to help improve light reflection efficiency and light extraction efficiency, and the encapsulant 1005 formed of a light-transmitting material to encapsulate the semiconductor light emitting device 1001 may be formed in the reflective cup. In an implementation, the encapsulant 1005 may include a wavelength conversion material, e.g., a phosphor or quantum dots.

In the semiconductor light emitting device according to an embodiment, luminous flux may be improved, and reliability may be enhanced.

One or more embodiments may provide a semiconductor light emitting device having improved external light extraction efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a substrate;
a light emitting structure including a first conductivity-type semiconductor layer, an active layer, and a second conductivity-type semiconductor layer sequentially stacked on the substrate;
a transparent electrode layer on the second conductivity-type semiconductor layer;
a first insulating layer on the transparent electrode layer and having a plurality of first through-holes;
a multilayer insulating structure on the first insulating layer and having a plurality of second through-holes overlapping the plurality of first through-holes, respectively;
a reflective electrode layer on the multilayer insulating structure and connected to the transparent electrode layer through the plurality of first through-holes and the plurality of second through-holes; and
a second insulating layer between the multilayer insulating structure and the reflective electrode layer, wherein the reflective electrode layer is disposed above the second insulating layer.

2. The semiconductor light emitting device as claimed in claim 1, wherein the multilayer insulating structure has a distributed Bragg reflector structure in which insulating films having different refractive indices are alternately stacked.

3. The semiconductor light emitting device as claimed in claim 2, wherein:
the reflective electrode layer includes Ag, and
the multilayer insulating structure includes TiO2.

4. The semiconductor light emitting device as claimed in claim 3, wherein the second insulating layer includes SiO2 or SiN.

5. The semiconductor light emitting device as claimed in claim 1, further comprising a third insulating layer covering upper and side surfaces of the reflective electrode layer.

6. The semiconductor light emitting device as claimed in claim 5, wherein the first insulating layer and the third insulating layer are in direct contact with each other at an edge of the light emitting structure.

7. The semiconductor light emitting device as claimed in claim 5, further comprising:
a first connection electrode in contact with the first conductivity-type semiconductor layer and passing through the first insulating layer, the second insulating layer, and the third insulating layer; and
a second connection electrode in contact with the reflective electrode layer and passing through the third insulating layer.

8. The semiconductor light emitting device as claimed in claim 7, further comprising:
a first electrode pad connected to the first connection electrode;
a second electrode pad connected to the second connection electrode;
a first solder pillar connected to the first electrode pad;
a second solder pillar connected to the second electrode pad; and
a molding portion covering side surfaces of the first solder pillar and the second solder pillar.

9. The semiconductor light emitting device as claimed in claim 1, wherein the second insulating layer extends between the reflective electrode layer and the first insulating layer.

10. The semiconductor light emitting device as claimed in claim 1, wherein the multilayer insulating structure is not exposed at an external surface of the semiconductor light emitting device.

11. The semiconductor light emitting device as claimed in claim 1, wherein the second insulating layer covers an outermost side surface of the multilayer insulating structure, wherein the outermost side surface comprises a side surface of the multilayer insulating structure horizontally closest to an exterior of the semiconductor light emitting device.

12. A semiconductor light emitting device, comprising:
a light emitting structure having a stack structure including a first conductivity-type semiconductor layer, an active layer, and a second conductivity-type semiconductor layer and including a recess region in which the second conductivity-type semiconductor layer, the active layer, and a portion of the first conductivity-type semiconductor layer have been removed and a mesa region adjacent to the recess region;
a transparent electrode layer on the second conductivity-type semiconductor layer;
a first insulating layer on the transparent electrode layer and having a plurality of first through-holes overlapping the mesa region;
a multilayer insulating structure on the first insulating layer and having a plurality of second through-holes overlapping the plurality of first through-holes, respectively;
a second insulating layer covering upper and side surfaces of the multilayer insulating structure; and
a reflective electrode layer on the second insulating layer and connected to the transparent electrode layer through the plurality of first through-holes and the plurality of second through-holes, wherein the reflective electrode layer is disposed above the second insulating layer.

13. The semiconductor light emitting device as claimed in claim 12, wherein the multilayer insulating structure has a distributed Bragg reflector structure in which a first insulating film having a first refractive index and a second insulating film having a second refractive index are alternately stacked.

14. The semiconductor light emitting device as claimed in claim 13, wherein:
the first insulating film includes SiO2, and
the second insulating film includes TiO2.

15. The semiconductor light emitting device as claimed in claim 13, wherein:
the multilayer insulating structure has a first surface in contact with the first insulating layer and a second surface opposite to the first surface,
the first insulating film is on the first surface of the multilayer insulating structure, and
the second insulating film is on the second surface of the multilayer insulating structure.

16. The semiconductor light emitting device as claimed in claim 12, further comprising a third insulating layer covering upper and side surfaces of the reflective electrode layer.

17. The semiconductor light emitting device as claimed in claim 16, wherein the first insulating layer and the third insulating layer are in direct contact with each other in a region overlapping the recess region of the light emitting structure.

18. A semiconductor light emitting device, comprising:
a light emitting structure including a first conductivity-type semiconductor layer, an active layer, and a second conductivity-type semiconductor layer that are sequentially stacked;
a transparent electrode layer on the second conductivity-type semiconductor layer;
a first insulating layer on the transparent electrode layer and having a first through-hole;
a multilayer insulating structure on the first insulating layer and having a second through-hole overlapping the first through-hole;
a reflective electrode layer on the multilayer insulating structure and connected to the transparent electrode layer through the first through-hole and the second through-hole;
a second insulating layer between the multilayer insulating structure and the reflective electrode layer; and
a third insulating layer covering upper and side surfaces of the reflective electrode layer,
wherein the first insulating layer and the third insulating layer are in direct contact with each other at an edge of the light emitting structure.

19. The semiconductor light emitting device as claimed in claim 18, wherein the multilayer insulating structure has a distributed Bragg reflector structure in which a first insulating film including SiO2 and a second insulating film including TiO2 are alternately stacked.

20. The semiconductor light emitting device as claimed in claim 19, wherein:
the reflective electrode layer includes Ag, and
the first insulating layer and the second insulating layer each independently include SiO2 or SiN.

* * * * *